(12) United States Patent
Holonyak, Jr. et al.

(10) Patent No.: US 8,638,830 B2
(45) Date of Patent: Jan. 28, 2014

(54) LIGHT EMITTING AND LASING SEMICONDUCTOR DEVICES AND METHODS

(75) Inventors: Nick Holonyak, Jr., Urbana, IL (US); Milton Feng, Champaign, IL (US); Gabriel Walter, Champaign, IL (US)

(73) Assignees: Quantum Electro Opto Systems Sdn. Bhd., Melaka (MY); The Board of Trustees of The University of Illinois, Urbana, IL (US)

( * ) Notice: Subject to any disclaimer, the term of this patent is extended or adjusted under 35 U.S.C. 154(b) by 453 days.

(21) Appl. No.: 12/655,807

(22) Filed: Jan. 7, 2010

(65) Prior Publication Data
US 2010/0202484 A1 Aug. 12, 2010

Related U.S. Application Data

(60) Provisional application No. 61/204,560, filed on Jan. 8, 2009, provisional application No. 61/204,602, filed on Jan. 8, 2009, provisional application No. 61/208,422, filed on Feb. 24, 2009.

(51) Int. Cl.
*H01S 5/34* (2006.01)
*H01L 33/04* (2010.01)

(52) U.S. Cl.
USPC ... 372/46.01; 372/45.01; 257/83; 257/E33.07

(58) Field of Classification Search
USPC .............. 372/46.01, 45.01; 257/83, E33.007
See application file for complete search history.

(56) References Cited

U.S. PATENT DOCUMENTS

| | | | |
|---|---|---|---|
| 7,091,082 B2 | 8/2006 | Feng et al. | 438/235 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,711,015 B2 | 5/2010 | Holonyak et al. | 372/11 |
| 7,813,396 B2 | 10/2010 | Feng et al. | 372/43.01 |
| 2001/0050934 A1 | 12/2001 | Choqnette et al. | 372/43 |
| 2005/0040432 A1 | 2/2005 | Feng et al. | 257/198 |
| 2005/0054172 A1 | 3/2005 | Feng et al. | 438/313 |
| 2006/0093010 A1 | 5/2006 | Sekiya et al. | 372/99 |
| 2008/0089368 A1 | 4/2008 | Feng et al. | 372/25 |

(Continued)

FOREIGN PATENT DOCUMENTS

JP 61-270885 * 1/1986

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

(Continued)

*Primary Examiner* — Jessica Stultz
*Assistant Examiner* — Michael Carter
(74) *Attorney, Agent, or Firm* — Martin Novack (57) ABSTRACT

A semiconductor light emitting device, including: a heterojunction bipolar light-emitting transistor having a base region between emitter and collector regions; emitter, base, and collector electrodes for coupling electrical signals with the emitter, base, and collector regions, respectively; and a quantum size region in the base region; the base region including a first base sub-region on the emitter side of the quantum size region, and a second base sub-region on the collector side of the quantum size region; and the first and second base sub-regions having asymmetrical band structures.

27 Claims, 9 Drawing Sheets

(56) References Cited

U.S. PATENT DOCUMENTS

| | | | |
|---|---|---|---|
| 2008/0205461 A1 | 8/2008 | Henrichs | 372/29.023 |
| 2008/0240173 A1 | 10/2008 | Holonyak et al. | 372/9 |
| 2009/0134939 A1 | 5/2009 | Feng et al. | 327/581 |
| 2010/0034228 A1 | 2/2010 | Holonyak et al. | 374/45 |
| 2010/0103971 A1 | 4/2010 | Then et al. | 372/45.01 |

OTHER PUBLICATIONS

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan , N. Holonyak, Jr. , A. James , G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed ($\geq$.1 GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz—Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 µm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

\* cited by examiner

| Layer | Comment | Material | X | Thickness (A) | Type | Dopant | Level (/cm³) |
|---|---|---|---|---|---|---|---|
| 24 | Contact | GaAs |  | 2000 | N+ | Si | 5.00E+18 |
| 23 | Confining | Al(x)Ga(1-x)As | 0.3 | 500 | N | Si | 3.00E+18 |
| 22 | Oxide Buffer | Al(x)Ga(1-x)As | 0.9-0.3 | 212 | N | Si | 2.00E+18 |
| 21 | Aperture | Al(x)Ga(1-x)As | 0.98 | 595 | N | Si | 2.00E+18 |
| 20 | Oxide Buffer | Al(x)Ga(1-x)As | 0.3-0.9 | 213 | N | Si | 2.00E+18 |
| 19 | Ordered | In(x)Ga(1-x)P | 0.49 | 511 | N- | Si | 5.00E+17 |
| 18 | Base Contact Layer | Al(x)Ga(1-x)As | 0.05 | 162 | P | C | 5.00E+19 |
| 17 | Graded Base | Al(x)Ga(1-x)As | 0.005-0.05 | 500 | P | C | 2E19 to 5E19 |
| 16 | Buffer | GaAs | 0 | 30 | i | UID | 1.00E+16 |
| 15 | QW | InGaAs | 980 nm | 112 | i | UID | 1.00E+16 |
| 14 |  | GaAs | 0 | 56 | i | UID | 1.00E+16 |
| 13 | QW | InGaAs | 980 nm | 112 | i | UID | 1.00E+16 |
| 12 | Buffer | GaAs | 0 | 30 | i | UID | 1.00E+16 |
| 11 | Base | GaAs | 0 | 106 | P | C | 2.00E+19 |
| 10 | Base | GaAs | 0 | 250 | P | C | 5.00E+19 |
| 9 | Collector | GaAs | 0 | 2871 | I | UID | 1.00E+16 |
| 8 | Ordered | In(x)Ga(1-x)P | 0.49 | 120 | N- | Si | 3.00E+17 |
| 7 | Contact Layer | GaAs | 0 | 417 | N | Si | 5.00E+18 |
| 6 |  | GaAs | 0 | 140 | N | Si | 5.00E+18 |
| 5 | Oxide Buffer | Al(x)Ga(1-x)As | 0.9-0.3 | 212 | N | Si | 2.00E+18 |
| 4 | Aperture | Al(x)Ga(1-x)As | 0.98 | 595 | N | Si | 2.00E+18 |
| 3 | Oxide Buffer | Al(x)Ga(1-x)As | 0.3-0.9 | 213 | N | Si | 2.00E+18 |
| 2 | Confining | Al(x)Ga(1-x)As | 0.3 | 500 | N | Si | 3.00E+18 |
| 1 | Doped Buffer | GaAs |  | 3000 | N | Si | 5.00E+18 |
|  | Substrate | 4" GaAs |  |  | SI (US) |  |  |

FIG. 12

| Layer | Comment | SL | Material | X | Thickness (A) | Wavelength | Type | Dopant | Level (/cm³) |
|---|---|---|---|---|---|---|---|---|---|
| 37 | Contact Layer | | GaAs | 0 | 501 | 0.18 | N | Si | 5.00E+18 |
| 36 | | | Al(x)Ga(1-x)As | 0.9-0.12 | 212 | 0.069 | N | Si | 1.50E+18 |
| 35 | DBR Set3 | x3 | Al(x)Ga(1-x)As | 0.9 | 587 | 0.18 | N | Si | 3.00E+18 |
| 34 | DBR Set3 | x3 | Al(x)Ga(1-x)As | 0.12-0.9 | 212 | 0.069 | N | Si | 1.50E+18 |
| 33 | DBR Set3 | x3 | Al(x)Ga(1-x)As | 0.12 | 512 | 0.18 | N | Si | 3.00E+18 |
| 32 | DBR Set3 | x3 | Al(x)Ga(1-x)As | 0.9-0.12 | 212 | 0.069 | N | Si | 1.50E+18 |
| 31 | | | Al(x)Ga(1-x)As | 0.9 | 587 | 0.18 | N | Si | 2.00E+18 |
| 30 | | | Al(x)Ga(1-x)As | 0.12-0.9 | 212 | 0.069 | N | Si | 1.50E+18 |
| 29 | | | Al(x)Ga(1-x)As | 0.12 | 512 | 0.18 | N | Si | 3.00E+18 |
| 28 | | | Al(x)Ga(1-x)As | 0.9-0.3 | 213 | 0.069 | N | Si | 3.00E+18 |
| 27 | Aperture | | Al(x)Ga(1-x)As | 0.98 | 595 | 0.18 | N | Si | 3.00E+18 |
| 26 | | | Al(x)Ga(1-x)As | 0.3-0.9 | 216 | 0.07 | N | Si | 3.00E+18 |
| 25 | Emitter | | In(x)Ga(1-x)P | 0.49 | 812 | 0.27 | N− | Si | 5.00E+17 |
| 24 | Base | | Al(x)Ga(1-x)As | 0.05 | 112 | 0.04 | P | C | 7.00E+19 |
| 23 | Base | | Al(x)Ga(1-x)As | 0.005 to 0.05 | 316 | 0.113 | P | C | 2E19 to 5E19 |
| 22 | Buffer | | GaAs | 0 | 23 | 0.008 | i | UID | 1.00E+16 |
| 21 | QW | 970 nm | In(x)Ga(1-x)As | 0.1 | 15 | 0.005 | i | UID | 1.00E+16 |
| 20 | QW | 970 nm | In(x)Ga(1-x)As | 0.2 | 140 | 0.051 | i | UID | 1.00E+16 |
| 19 | QW | 970 nm | In(x)Ga(1-x)As | 0.1 | 15 | 0.005 | i | UID | 1.00E+16 |
| 18 | Buffer | | GaAs | 0 | 23 | 0.008 | i | UID | 1.00E+16 |
| 17 | Base | | Al(x)Ga(1-x)As | 0 | 208 | 0.075 | P | C | 5E19 to 2E19 |
| 16 | Collector | | Al(x)Ga(1-x)As | 0 | 3029 | 1.09 | I | UID | 1.00E+16 |
| 15 | Etch Stop | | In(x)Ga(1-x)P | 0.49 | 120 | 0.04 | N− | Si | 5.00E+17 |
| 14 | Contact Layer | | Al(x)Ga(1-x)As | 0 | 612 | 0.22 | N | Si | 7.00E+18 |
| 13 | | | Al(x)Ga(1-x)As | 0.9-0.3 | 216 | 0.07 | N | Si | 1.50E+18 |
| 12 | DBR Set2 | x4 | Al(x)Ga(1-x)As | 0.9 | 587 | 0.18 | N | Si | 3.00E+18 |
| 11 | DBR Set2 | x4 | Al(x)Ga(1-x)As | 0.12-0.9 | 212 | 0.069 | N | Si | 1.50E+18 |
| 10 | DBR Set2 | x4 | Al(x)Ga(1-x)As | 0.12 | 512 | 0.18 | N | Si | 5.00E+18 |
| 9 | DBR Set2 | x4 | Al(x)Ga(1-x)As | 0.9-0.12 | 212 | 0.069 | N | Si | 1.50E+18 |
| 8 | DBR Set1 | x32 | Al(x)Ga(1-x)As | 0.9 | 587 | 0.18 | i | UID | 1.00E+16 |
| 7 | DBR Set1 | x32 | Al(x)Ga(1-x)As | 0.12-0.9 | 212 | 0.069 | i | UID | 1.00E+16 |
| 6 | DBR Set1 | x32 | Al(x)Ga(1-x)As | 0.12 | 512 | 0.18 | i | UID | 1.00E+16 |
| 5 | DBR Set1 | x32 | Al(x)Ga(1-x)As | 0.9-0.12 | 212 | 0.069 | i | UID | 1.00E+16 |
| 4 | | | Al(x)Ga(1-x)As | 0.9 | 587 | 0.18 | i | UID | 1.00E+16 |
| 3 | | | Al(x)Ga(1-x)As | 0.12-0.9 | 213 | 0.07 | i | UID | 1.00E+16 |
| 2 | | | Al(x)Ga(1-x)As | 0.12 | 512 | 0.18 | i | UID | 1.00E+16 |
| 1 | Buffer | | GaAs | | 2000 | | UID | − | 1.00E+16 |
| | Substrate | | 4" GaAs | | | | Si (US) | | |

FIG. 13

| Layer | Comment | SL | Material | X | Thickness (A) | Wavelength | Type | Dopant | Level (/cm³) |
|---|---|---|---|---|---|---|---|---|---|
|  |  |  |  |  |  |  |  |  |  |
|  |  |  |  |  |  |  |  |  |  |
| 37 | Contact Layer |  | GaAs | 0 | 501 | 0.18 | N | Si | 5.00E+18 |
| 36 |  |  | Al(x)Ga(1-x)As | 0.9-0.12 | 212 | 0.069 | N | Si | 1.50E+18 |
| 35 | DBR Set3 | x24 | Al(x)Ga(1-x)As | 0.9 | 587 | 0.18 | N | Si | 3.00E+18 |
| 34 | DBR Set3 | x24 | Al(x)Ga(1-x)As | 0.12-0.9 | 212 | 0.069 | N | Si | 1.50E+18 |
| 33 | DBR Set3 | x24 | Al(x)Ga(1-x)As | 0.12 | 512 | 0.18 | N | Si | 3.00E+18 |
| 32 | DBR Set3 | x24 | Al(x)Ga(1-x)As | 0.9-0.12 | 212 | 0.069 | N | Si | 1.50E+18 |
| 31 |  |  | Al(x)Ga(1-x)As | 0.9 | 587 | 0.18 | N | Si | 2.00E+18 |
| 30 |  |  | Al(x)Ga(1-x)As | 0.12-0.9 | 212 | 0.069 | N | Si | 1.50E+18 |
| 29 |  |  | Al(x)Ga(1-x)As | 0.12 | 512 | 0.18 | N | Si | 3.00E+18 |
| 28 |  |  | Al(x)Ga(1-x)As | 0.9-0.3 | 213 | 0.069 | N | Si | 3.00E+18 |
| 27 | Aperture |  | Al(x)Ga(1-x)As | 0.98 | 595 | 0.18 | N | Si | 3.00E+18 |
| 26 |  |  | Al(x)Ga(1-x)As | 0.3-0.9 | 216 | 0.07 | N | Si | 3.00E+18 |
| 25 | Emitter |  | In(x)Ga(1-x)P | 0.49 | 812 | 0.27 | N- | Si | 5.00E+17 |
| 24 | Base |  | Al(x)Ga(1-x)As | 0.05 | 112 | 0.04 | P | C | 7.00E+19 |
| 23 | Base |  | Al(x)Ga(1-x)As | 0.005 to 0.05 | 316 | 0.113 | P | C | 2E19 to 5E19 |
| 22 | Buffer |  | GaAs | 0 | 23 | 0.008 | i | UID | 1.00E+16 |
| 21 | QW | 970 nm | In(x)Ga(1-x)As | 0.1 | 15 | 0.005 | i | UID | 1.00E+16 |
| 20 | QW | 970 nm | In(x)Ga(1-x)As | 0.2 | 140 | 0.051 | i | UID | 1.00E+16 |
| 19 | QW | 970 nm | In(x)Ga(1-x)As | 0.1 | 15 | 0.005 | i | UID | 1.00E+16 |
| 18 | Buffer |  | GaAs | 0 | 23 | 0.008 | i | UID | 1.00E+16 |
| 17 | Base |  | Al(x)Ga(1-x)As | 0 | 208 | 0.075 | P | C | 5E19 to 2E19 |
| 16 | Collector |  | Al(x)Ga(1-x)As | 0 | 3029 | 1.09 | I | UID | 1.00E+16 |
| 15 | Etch Stop |  | In(x)Ga(1-x)P | 0.49 | 120 | 0.04 | N- | Si | 5.00E+17 |
| 14 | Contact Layer |  | Al(x)Ga(1-x)As | 0 | 612 | 0.22 | N | Si | 7.00E+18 |
| 13 |  |  | Al(x)Ga(1-x)As | 0.9-0.3 | 216 | 0.07 | N | Si | 1.50E+18 |
| 12 | DBR Set2 | x4 | Al(x)Ga(1-x)As | 0.9 | 587 | 0.18 | N | Si | 3.00E+18 |
| 11 | DBR Set2 | x4 | Al(x)Ga(1-x)As | 0.12-0.9 | 212 | 0.069 | N | Si | 1.50E+18 |
| 10 | DBR Set2 | x4 | Al(x)Ga(1-x)As | 0.12 | 512 | 0.18 | N | Si | 5.00E+18 |
| 9 | DBR Set2 | x4 | Al(x)Ga(1-x)As | 0.9-0.12 | 212 | 0.069 | N | Si | 1.50E+18 |
| 8 | DBR Set1 | x32 | Al(x)Ga(1-x)As | 0.9 | 587 | 0.18 | i | UID | 1.00E+16 |
| 7 | DBR Set1 | x32 | Al(x)Ga(1-x)As | 0.12-0.9 | 212 | 0.069 | i | UID | 1.00E+16 |
| 6 | DBR Set1 | x32 | Al(x)Ga(1-x)As | 0.12 | 512 | 0.18 | i | UID | 1.00E+16 |
| 5 | DBR Set1 | x32 | Al(x)Ga(1-x)As | 0.9-0.12 | 212 | 0.069 | i | UID | 1.00E+16 |
| 4 |  |  | Al(x)Ga(1-x)As | 0.9 | 587 | 0.18 | i | UID | 1.00E+16 |
| 3 |  |  | Al(x)Ga(1-x)As | 0.12-0.9 | 213 | 0.07 | i | UID | 1.00E+16 |
| 2 |  |  | Al(x)Ga(1-x)As | 0.12 | 512 | 0.18 | i | UID | 1.00E+16 |
| 1 | Buffer |  | GaAs |  | 2000 |  | UID | - | 1.00E+16 |
|  | Substrate |  | 4" GaAs |  |  |  | Si (US) |  |  |

FIG. 14

| Layer | Comment | Material | X | Thickness (A) | Type | Dopant | Level (/cm³) |
|---|---|---|---|---|---|---|---|
| 24 | Contact | GaAs | | 2000 | N+ | Si | 5.00E+18 |
| 23 | Confining | Al(x)Ga(1-x)As | 0.3 | 500 | N | Si | 3.00E+18 |
| 22 | Oxide Buffer | Al(x)Ga(1-x)As | 0.9-0.3 | 212 | N | Si | 2.00E+18 |
| 21 | Aperture | Al(x)Ga(1-x)As | 0.98 | 3000 | N | Si | 2.00E+18 |
| 20 | Oxide Buffer | Al(x)Ga(1-x)As | 0.3-0.9 | 213 | N | Si | 2.00E+18 |
| 19 | Emitter | In(x)Ga(1-x)P | 0.49 | 511 | N- | Si | 5.00E+17 |
| 18 | Base Contact Layer | Al(x)Ga(1-x)As | 0.05 | 162 | P | C | 5.00E+19 |
| 17 | Graded Base | Al(x)Ga(1-x)As | 0.005-0.05 | 500 | P | C | 2E19 to 5E19 |
| 16 | Buffer | GaAs | 0 | 30 | i | UID | 1.00E+16 |
| 15 | QW | InGaAs | 980 nm | 112 | i | UID | 1.00E+16 |
| 14 | | GaAs | 0 | 56 | i | UID | 1.00E+16 |
| 13 | QW | InGaAs | 980 nm | 112 | i | UID | 1.00E+16 |
| 12 | Buffer | GaAs | 0 | 30 | i | UID | 1.00E+16 |
| 11 | Base | GaAs | 0 | 106 | P | C | 2.00E+19 |
| 10 | Base | GaAs | 0 | 250 | P | C | 5.00E+19 |
| 9 | Collector | GaAs | 0 | 2871 | I | UID | 1.00E+16 |
| 8 | Etch stop | In(x)Ga(1-x)P | 0.49 | 120 | N- | Si | 3.00E+17 |
| 7 | Contact Later | GaAs | 0 | 417 | N | Si | 5.00E+18 |
| 6 | | GaAs | 0 | 140 | N | Si | 5.00E+18 |
| 5 | Oxide Buffer | Al(x)Ga(1-x)As | 0.9-0.3 | 212 | N | Si | 2.00E+18 |
| 4 | Aperture | Al(x)Ga(1-x)As | 0.98 | 3000 | N | Si | 2.00E+18 |
| 3 | Oxide Buffer | Al(x)Ga(1-x)As | 0.3-0.9 | 213 | N | Si | 2.00E+18 |
| 2 | Confining | Al(x)Ga(1-x)As | 0.3 | 500 | N | Si | 3.00E+18 |
| 1 | Doped Buffer | GaAs | | 3000 | N | Si | 5.00E+18 |
| | Substrate | 4" GaAs | | | SI (US) | | |

FIG. 15

LIGHT EMITTING AND LASING SEMICONDUCTOR DEVICES AND METHODS

PRIORITY CLAIMS

Priority is claimed from U.S. Provisional Patent Application Ser. No. 61/204,560, filed Jan. 8, 2009, and from U.S. Provisional Patent Application Ser. No. 61/204,602, filed Jan. 8, 2009, and from U.S. Provisional Patent Application Ser. No. 61/208,422, filed Feb. 24, 2009, and all of said U.S. Provisional Patent Applications are incorporated herein by reference.

RELATED APPLICATION

The subject matter of this application relates to subject matter disclosed in copending U.S. patent application Ser. No. 12/655,806, filed of even date herewith and assigned to the same assignees as the present application.

FIELD OF THE INVENTION

This invention relates to methods and devices for producing light emission and laser emission in response to electrical signals. The invention also relates to methods for producing light emission and laser emission from semiconductor transistor devices with improved efficiency.

BACKGROUND OF THE INVENTION

A part of the background hereof lies in the development of wide bandgap semiconductors to achieve high minority carrier injection efficiency in a device known as a heterojunction bipolar transistor (HBT). These transistor devices are capable of operation at extremely high speeds. For example, InP HBTs have, in recent years, been demonstrated to exhibit operation at speeds above 500 GHz.

Another part of the background hereof lies in the development of heterojunction bipolar transistors which operate as light-emitting transistors and transistor lasers. Reference can be made for example, to U.S. Pat. Nos. 7,091,082, 7,286,583, 7,354,780, and 7,535,034; U.S. Patent Application Publication Numbers US2005/0040432, US2005/0054172, US2008/0240173, and US2009/0134939; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); and Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008).

The basis of a fast transistor is in its ability to enhance electron-hole pair recombination through the large build in majority carriers in the base, fast transport of minority carriers through the base, and the collection mechanism (electrical collector) that collects unrecombined minority carriers out of the base region; all of which supports the fast charging and discharging of charge storage capacitance in the base region.

Optical operation of a heterojunction bipolar light emitting transistor (HBLET), as described in the above-referenced patents and publications, depends on the radiative recombination component in the base region which typically occurs dominantly in an embedded quantum size region in the base, for example an undoped quantum well (QW). Together, the sum of the non-radiative recombination current component ($I_{non-rad}$) which dominantly occurs in the highly doped region of the base, and radiative recombination component ($I_{rad}$) in the base, is equal to the supplied base current ($I_b = I_{non-rad} + I_{rad}$).

The addition of a QW in a base region allows the incorporation of an efficient radiative recombination center. From a 1-dimensional point of view, carriers are captured in the QW and recombined radiatively, or swept out of the base into the electrical collector. However, in reality, captured carriers do not recombine immediately, resulting in potential charge build up in the quantum well. Carriers that are accumulating in the quantum well region would redistribute through efficient lateral diffusion, spreading carriers and recombination events sideways and away from the optical cavity of the device. Captured carriers could also simultaneously re-thermalize back into the base region as they travel laterally.

It is among the objects hereof to overcome limitations of prior art light-emitting transistors (LETs) and transistor lasers (TLs), for example the type of limitation described just above.

SUMMARY OF THE INVENTION

As above-indicated, captured carriers do not recombine immediately, resulting in potential charge build-up in the quantum well, and accumulating carriers redistribute through lateral diffusion, thereby spreading carriers and recombination events sideways and away from the device's optical cavity. Captured carriers could also simultaneously re-thermalize back into the base region as they travel laterally.

Applicant believes that one of the main factors leading to the saturation behavior and reduced quantum efficiency in the described devices is the rethermalization of carriers back towards the emitter side (back diffusion). Therefore, in accordance with a feature hereof, an asymmetric base design is employed to minimize the non-radiative recombination component due to the back diffusion of carriers.

In accordance with a form of the invention, a method is set forth for improving operation of a light emitting transistor, including the following steps: providing a light emitting transistor that includes emitter, base, and collector semiconductor regions, and a quantum size region within the base region, the base region comprising a first base sub-region on the emitter side of said quantum size region, and a second base sub-region on the collector side of said quantum size region; and providing said first and second base sub-regions with asymmetrical band structures. In an embodiment of this form of the invention, the step of providing the first and second base sub-regions with asymmetrical band structures comprises providing the first base sub-region with a higher bandgap semiconductor material than the semiconductor material of the second base sub-region. In one version of this embodiment, the step of providing the first base sub-region with a higher bandgap semiconductor material than the semiconductor material of the second base sub-region includes providing the first base sub-region with a graded bandgap semiconductor material. The graded bandgap semiconductor material is graded to have a gradually increasing bandgap in the direction of said emitter. In another version of this embodiment, the step of providing the first base sub-region with a higher bandgap semiconductor material than the semiconductor material of the second base sub-region includes providing the first base sub-region with a stepped bandgap semiconductor material. In a further version of this embodiment, the step of providing the first base sub-region with a higher bandgap semiconductor material than the semiconductor material of the second base sub-region includes providing the first base sub-region with a graded and stepped bandgap semiconductor material.

In accordance with another form of the invention a semiconductor light emitting device is provided, comprising: a heterojunction bipolar light-emitting transistor having a base region between emitter and collector regions; emitter, base, and collector electrodes for coupling electrical signals with the emitter, base, and collector regions, respectively; and a quantum size region in the base region; the base region including a first base sub-region on the emitter side of the quantum size region, and a second base sub-region on the collector side of the quantum size region; and the first and second base sub-regions having asymmetrical band structures. A resonant optical cavity can enclose at least a portion of the base region, whereby the device can comprise a transistor laser. In an embodiment of this form of the invention, the quantum size region within the base region comprises at least one quantum well within the base region. In another embodiment of this form of the invention, the quantum size region within the base region comprises at least one layer of quantum dots within the base region.

Further features and advantages of the invention will become more readily apparent from the following detailed description when taken in conjunction with the accompanying drawings.

DETAILED DESCRIPTION

Figure 1:
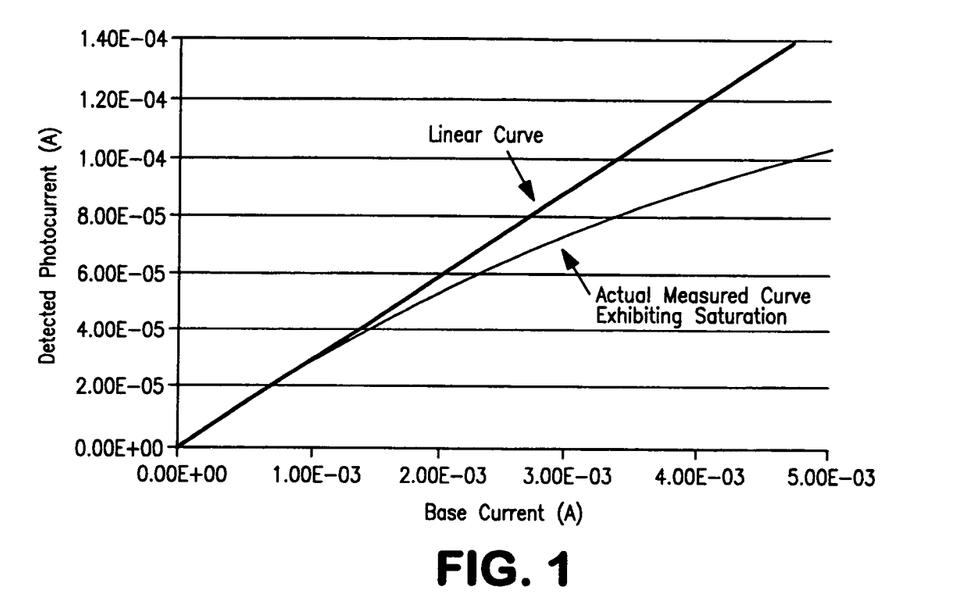
FIG. 1 is a graph showing measured photon output from a quantum well-heterojunction bipolar light emitting transistor as a function of base current.

Applicant has observed that the radiative recombination component does not increase linearly with base current. FIG. 1 shows measured photon output from a QW-HBLET exhibiting saturation behavior (departure from linear curve) at higher base current indicating an increase in non-radiative recombination component. In addition, Applicant has also observed that the radiative recombination component is also a strong function of temperature. These observations further suggest that non-radiative recombination activity, and therefore bulk base recombination, also increases as a function of both current density and temperature.

Figure 2:
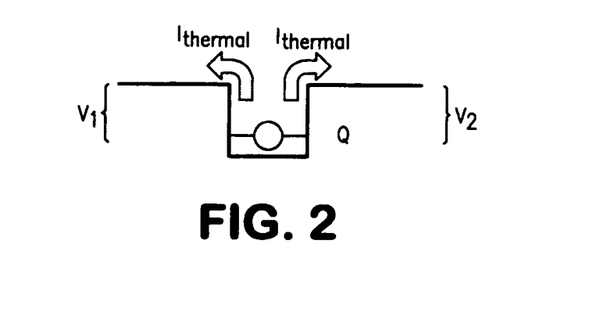
FIG. 2 is an energy band diagram for a typical quantum well in a base region, which is useful in understanding the thermalization current phonomena.

Referring to FIG. 2, which shows an energy band diagram for a typical quantum well in a base region, the thermalization current ($I_{thermal}$) depends mainly on two variables, phonon energy (proportionate to temperature, T) and the barrier height (V) in which the carriers are confined, as seen from the following relationships:

$$I_{thermal1} \propto e^{-\frac{qV1}{kT}}$$
$$I_{thermal2} \propto e^{-\frac{qV2}{kT}}$$
$$\frac{I_{thermal1}}{I_{thermal2}} = e^{-\frac{q(V1-V2)}{kT}}$$

where q is the coulomb charge $1.6 \times 10^{-19}$ C, and k is the Boltzman constant. Captured carriers in the quantum well thermalize out of the quantum well through the assistance of phonons. For a symmetrical quantum well ($\Delta V = V_1 - V_2 = 0$), the probability of the carriers thermalizing to either side of QW is equal, $$\frac{I_{thermal1}}{I_{thermal2}} = 1.$$

The equations above also show that a deep QW (large $V_1, V_2$) reduces the thermal current as a whole. However, a deeper QW increases the QW ability to store charge which will significantly decrease the high speed capability of the device. Due to better confinement of captured carriers, a deep QW is also more efficient regarding lateral diffusion of captured carriers. On the other extreme, the use of shallow well increases the rethermalization rate of captured carriers that competes with the recombination rate of the QW, which could lead to a high gain device. In accordance with a feature hereof, one or more relatively shallow QWs can be employed, thereby achieving advantages of speed and high gain, but without the concomitant re-thermalization problems that might normally dictate against the use of shallow well(s)—since the relatively higher bandgap first base sub-region will tend to reduce re-thermalized carriers movement toward the emitter region. These carriers will tend to flow back into the QW(s). In an embodiment hereof, the shallow well(s) used in conjunction with the asymmetrical base feature are limited to have a single energy state; that is, the ground state.

Figure 3:
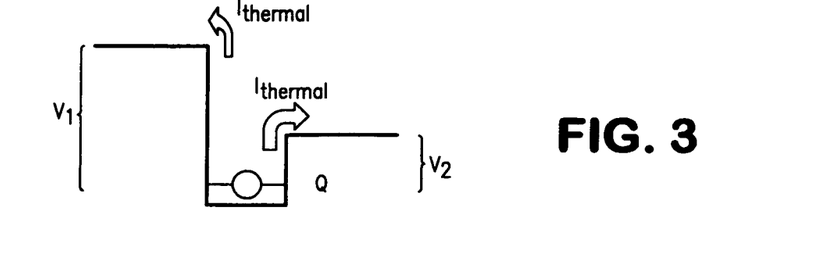
FIG. 3 is an energy band diagram for a Type 1 arrangement hereof with the material of the first base sub-region on the emitter side of the quantum well having a larger bandgap than the material of the second base sub-region on the collector side of the quantum well.

FIG. 3 shows a Type 1 arrangement with the material of the first base sub-region on the emitter side having a larger bandgap than the material of the second base sub-region on the collector side. This arrangement provides the largest possible Ithermal1/Ithermal2 ratio. However, most large bandgap materials have relatively lower mobility that reduces the transit time of carriers.

Figure 4:
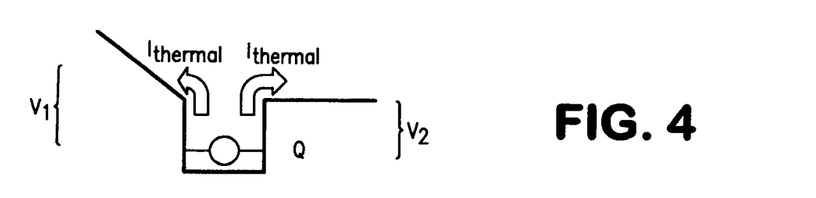
FIG. 4 is an energy band diagram for a Type 2 arrangement hereof, with a graded wide bandgap structure of the first base sub-region.

FIG. 4 shows a Type 2 arrangement. A graded wide bandgap structure for the first base sub-region allows a built-in field that assists in the transit of carriers, therefore reducing the impact of lower intrinsic mobility of higher bandgap material. The graded field also assists any rethermalized carriers in the first base sub-region to flow back into the quantum well. The effective barrier height ($V_1$) is lower than that in the Type 1 structure due to the graded effect.

Figure 5:
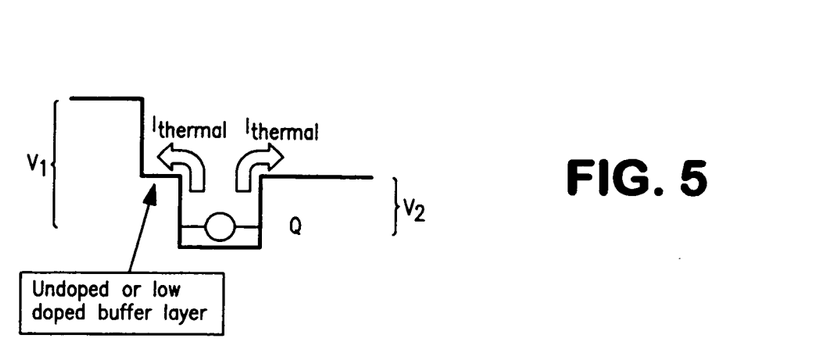
FIG. 5 is an energy band diagram for a Type 3 arrangement hereof, with the first base sub-region having a stepped bandgap.

FIG. 5 shows a Type 3 arrangement with the first base sub-region having a stepped bandgap. In this example, the wide bandgap material is grown after an undoped or low doped buffer layer is grown. A buffer layer may be necessary for material growth purposes.

Figure 6:
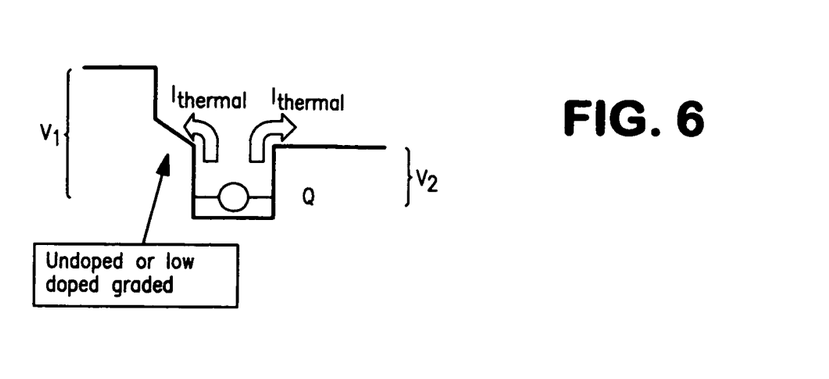
FIG. 6 is an energy band diagram for a Type 4 arrangement hereof, with the first base sub-region having a graded and then stepped bandgap.

FIG. 6 shows a Type 4 arrangement with the first base sub-region having a graded and then stepped bandgap. The wide bandgap material is grown after an undoped or low doped graded buffer layer is grown. A graded buffer helps thermalized carriers to be swept back into the quantum well, minimizing the recombination event in the buffer layer. Low doped or undoped layers minimizes the non-radiative recombination capability of that layer.

Figure 7:
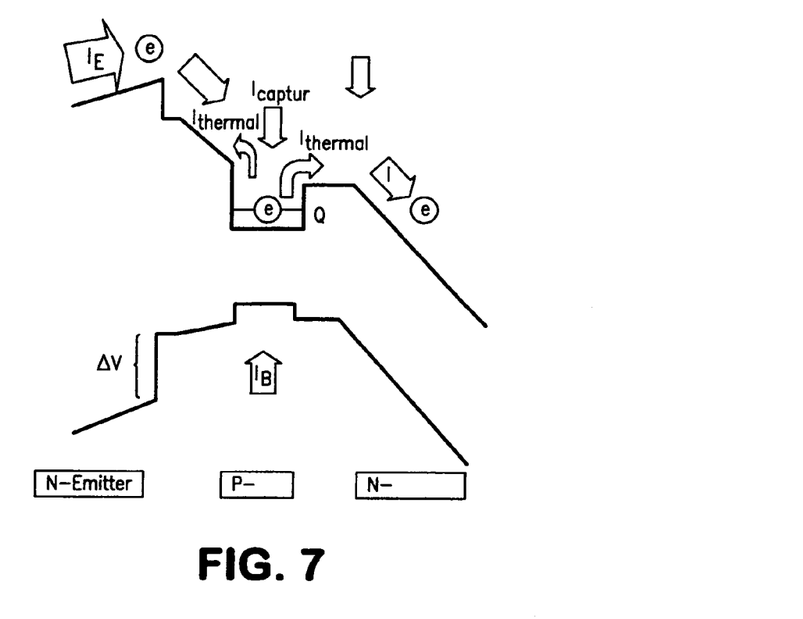
FIG. 7 is an energy band diagram of a device in accordance with an embodiment hereof which in this example is an npn light-emitting transistor or transistor laser which includes a base region having a quantum well and an asymmetrical band structure on opposite sides of the quantum well.

Referring to FIG. 7, there is shown an energy band diagram of a device in accordance with an embodiment hereof which in this example is an npn light-emitting transistor or transistor laser which includes a base region having a quantum well and an asymmetrical band structure on opposite sides of the quantum well. Under ideal conditions, thermalization of carriers should only be towards the collector where it can be collected. The widest bandgap region of the base is chosen in such that the valence band discontinuity ($\Delta V_v$) is still larger than 0 V in order to prevent the diffusion of holes into the emitter. The graded bandgap of the base assists, through a built-in electric field, in drifting electrons toward the electrical and optical (QW) collectors. It also assists in drifting built-in holes towards the collector.

Figure 8:
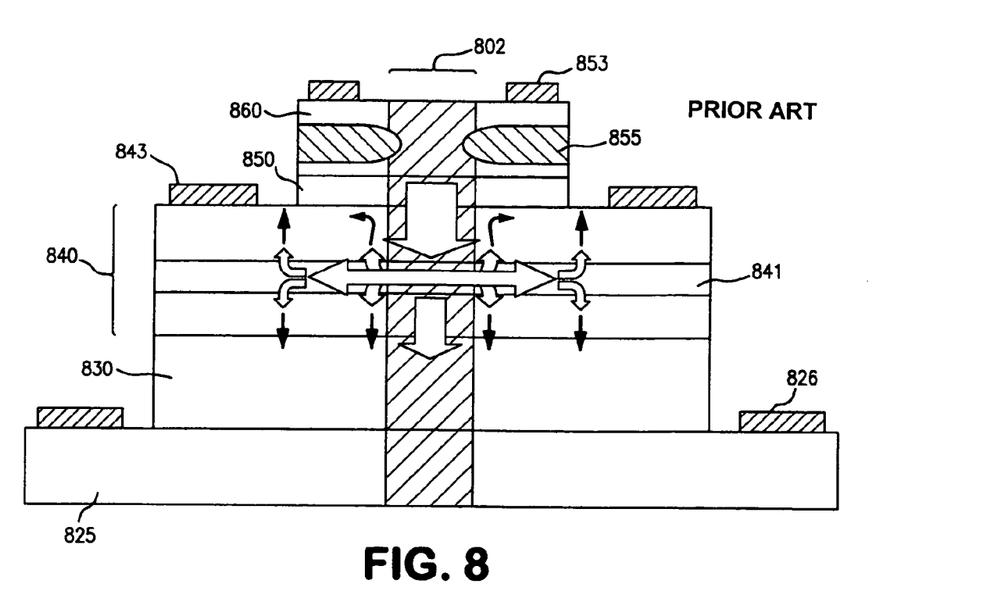
FIG. 8 is a cross-sectional view of a conventional QW-heterojunction bipolar light emitting transistor (QW-HBLET) with a deep QW design and homogenous doped base region. (Drawings are not to scale.)

Referring to FIG. 8, there is shown a conventional QW-heterojunction bipolar light emitting transistor (QW-HBLET) with a deep QW design and homogenous doped base region. Reference can be made, for example, to the patents and publications referenced in the Background portion hereof. In FIG. 8, the base region 840 is disposed between emitter region 850 and collector region 830, the base region including quantum well 841. Below collector 830 is a subcollector region 825 which has collector electrode 826 thereon. Above the emitter is the emitter confining and contact region 860 and oxide-defined aperture 855. The base region has base electrode 843 thereon, and the emitter region has emitter electrode 853 thereon. Appropriate biasing and excitation signals are applied to the electrodes as described, for example, in the patents and publications listed in the Background portion hereof. The relatively deep QW assists captured carriers to spread laterally and recombine away from the optical cavity (shaded region 802 for this vertical cavity device). In addition to that, as the carriers spread laterally (see arrows), the carriers can also rethermalize and carriers that rethermalize towards the emitter (back diffusion) are mostly lost to non-radiative recombination.

Figure 9:
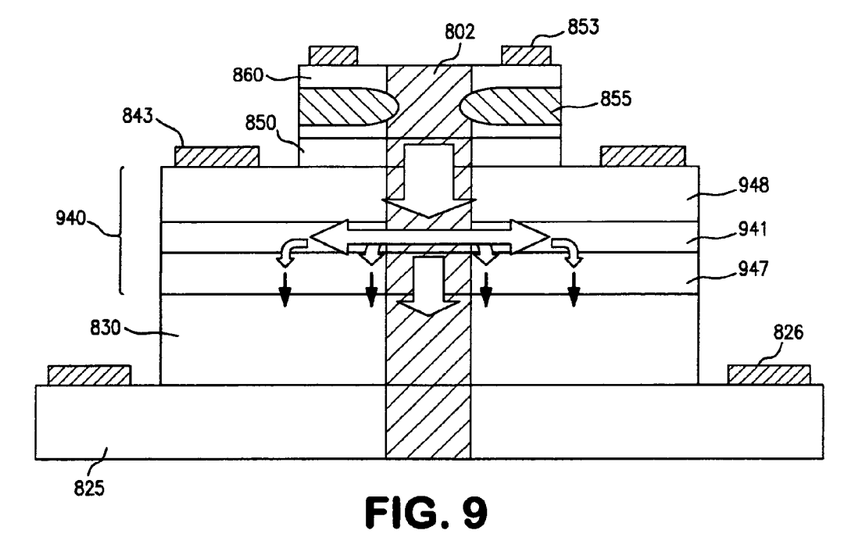
FIG. 9 is a cross-sectional view of a QW-HBLET structure in accordance with an embodiment hereof, having an asymmetric base design in order to eliminate or reduce rethermalization of carriers towards the emitter.

FIG. 9 shows a QW-HBLET structure in accordance with an embodiment hereof, having an asymmetric base design in order to eliminate or reduce rethermalization of carriers towards the emitter. In FIG. 9, the emitter region 850, collector region 830, subcollector 825, emitter confining and contact region 860, oxide-defined aperture 855, emitter electrode 853, base electrode 843, and collector electrode 826, are all similar to elements of like reference numerals in FIG. 8. However, in FIG. 9, the base 940 is provided with a relatively wider bandgap base sub-region 948 on the emitter side as compared to a relatively narrow bandgap sub-region 947 on the collector side. The FIG. 9 arrows (i.e., the absence thereof in the base upper sub-region) represent the reduction in back diffusion. As described above, the higher bandgap sub-region can preferably be achieved by providing the sub-region with a graded bandgap semiconductor materials and/or stepped bandgap semiconductor materials.

Figure 10:
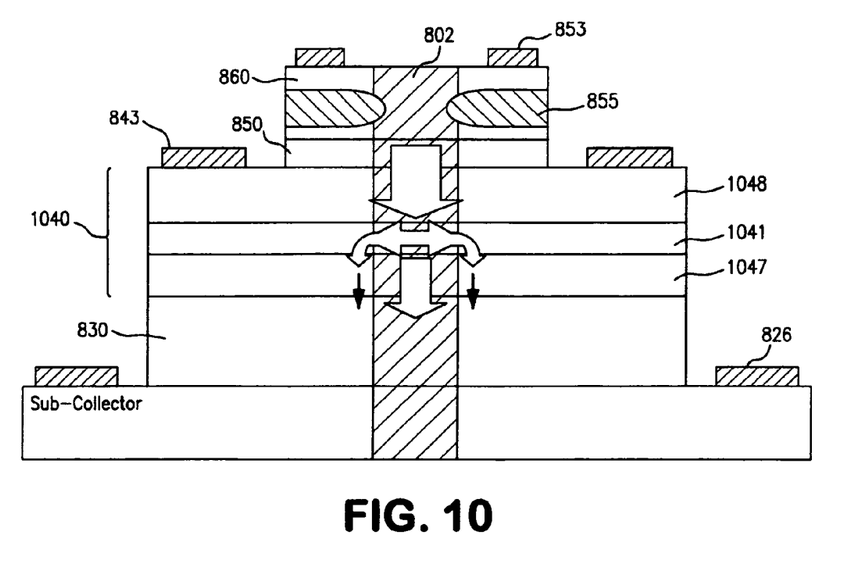
FIG. 10 is a cross-sectional view of a QW-HBLET structure in accordance with a further embodiment hereof, having an asymmetric base design to reduce rethermalization of carriers towards the emitter side and use of one or more shallow quantum well(s) [QW(s)] in order to limit the lateral diffusion of captured carriers.

FIG. 10 shows a QW-HBLET structure in accordance with a further embodiment hereof, having an asymmetric base design to reduce rethermalization of carriers towards the emitter side and use of one or more shallow quantum well(s) [QW(s)] in order to limit the lateral diffusion of captured carriers. In FIG. 10, like reference numerals represent similar elements of the devices of FIGS. 8 and 9. In FIG. 10, as in FIG. 9, the base region (1040, in FIG. 10) has a relatively wider bandgap base sub-region (1048, in FIG. 10) on the emitter side of the base as compared to a relatively narrower bandgap sub-region (1047, in FIG. 10) on the collector side of the base. In this case, however, as above noted, a shallower quantum well 1041 is used in the base, in order to limit the lateral diffusion of captured carriers (see relatively shorter arrows in the lateral direction in FIG. 10).

Figure 11:
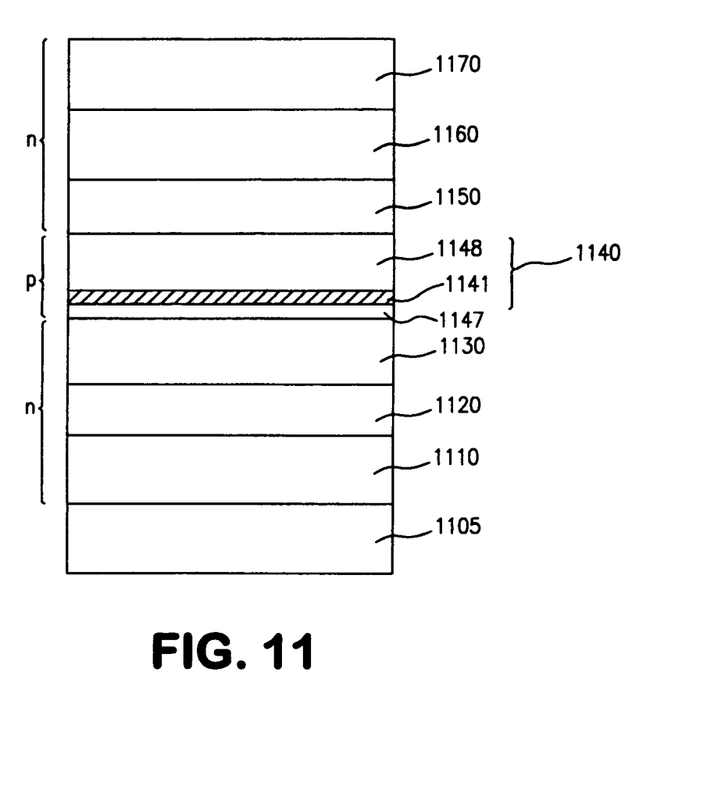
FIG. 11 is a diagram of the basic layer structure of a QW-HBLET with asymmetric base in accordance with an embodiment of the invention.

FIG. 11 shows the basic layer structure of a QW-HBLET with asymmetric base in accordance with an embodiment of the invention. In this example, the device is npn, although it will be understood that the principles hereof also apply to pnp devices. The substrate 1105 (doped or undoped) has deposited thereon an n-type lower confining layer 1110 with oxidizable aperture layer, an n-type collector contact layer 1120 and an n-type collector layer 1130. The heavily doped p-type base region 1140 includes a quantum well (QW) 1141, and sub-regions 1147 and 1148, with asymmetric design of their bandgaps, as previously described. Also shown are the n-type emitter 1150, n-type upper confining layer with oxidation aperture layer (1160), and emitter contact layer 1170.

Figure 12:
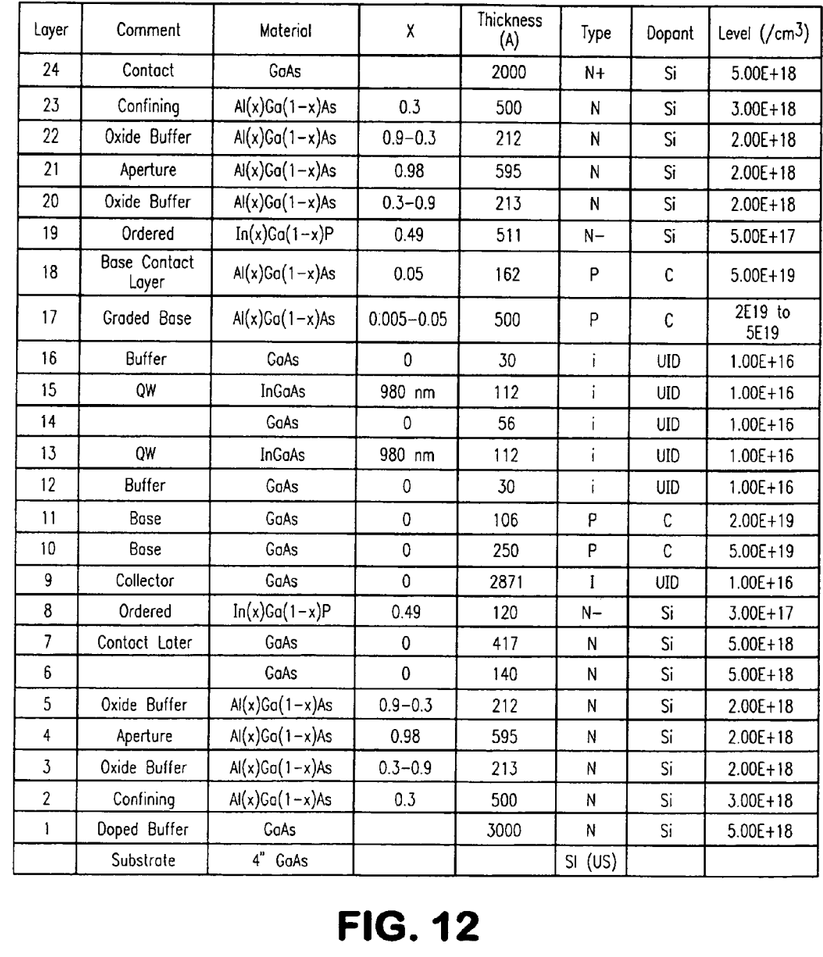
FIG. 12 shows a Table with a more detailed example of the layer structure of a QW-HBLET in accordance with an embodiment of the invention, and which employs a first base sub-region graded to have a gradually increasing bandgap in the direction of the emitter.

The table of FIG. 12 shows a more detailed example of the layer structure of a QW-HBLET in accordance with an embodiment of the invention, and which employs a first base sub-region graded to have a gradually increasing bandgap in the direction of the emitter. Upward from the GaAs substrate, the epitaxial layers of the crystal used for the QW-HBLET include a 3000 Å n-type doped GaAs buffer layer (Layer 1), a 500 Å graded $Al_{0.30}Ga_{0.70}As$ confining layer (Layer 2), a 213 Å graded $Al_{0.30}Ge_{0.70}As$ to $Al_{0.90}Ga_{0.10}As$ oxide buffer layer (Layer 3), a 595 Å n-type $Al_{0.98}Ge_{0.02}As$ oxidizable aperture layer (Layer 4), another 213 Å of graded $Al_{0.90}Ge_{0.10}As$ to $Al_{0.30}Ga_{0.70}As$ oxide buffer layer (Layer 5), followed by a 557 Å n-type GaAs contact layer (Layer 6 and 7), a 120 Å InGaP etch stop layer (Layer 8), a 2871 Å undoped collector layer. These layers are followed by 1358 Å of base layers (Layer 19 to 18) which includes two undoped 112 Å InGaAs quantum wells (Layer 12 to 16), and a graded $Al_{0.005}Ge_{0.995}As$ to $Al_{0.05}Ge_{0.95}As$ base layer with graded base doping (Layer 17).

Later, a heterostructure emitter including a 511 Å n-type $In_{0.49}Ga_{0.51}P$ layer (Layer 19), a 213 Å graded $Al_{0.30}Ge_{0.70}As$ to $Al_{0.90}Ga_{0.10}As$ oxide buffer layer (Layer 20), a 595 Å n-type $Al_{0.98}Ge_{0.02}As$ oxidizable aperture layer (Layer 21), another 213 Å of graded $Al_{0.90}Ge_{0.10}As$ to $Al_{0.30}Ga_{0.70}As$ oxide buffer layer (Layer 22), a 500 Å graded $Al_{0.30}Ga_{0.70}As$ confining layer (Layer 23). The structure is completed with a 2000 Å GaAs top contact layer (Layer 24).

An example of the QW-HBLET fabrication process for an embodiment hereof is performed by first patterning protective $SiN_4$ on the crystal with a photolithography step and reactive ion etching with Freon 14 (CEO gas. The top n-type GaAs contact layer (Layer 24) and AlGaAs layers (Layer 20 to 23) are then exposed by wet etching (1:8:80 $H_2O_2$:$H_2SO_4$:$H_2O$) to form the emitter mesa and reveal the n-type $In_{0.49}Ga_{0.51}P$ wide-gap emitter layer (Layer 19). The sample is oxidized at 425° C. in a furnace supplied with $N_2$+$H_2O$, resulting in lateral oxidation which forms oxide-defined apertures in the emitter mesa. The samples are annealed (in $N_2$) at 425° C. for 7 minutes to reactivate p-dopants before the protective $SiN_4$ is removed by plasma (CEO etching. The emitter layer (Layer 19), $In_{0.49}Ga_{0.51}P$, is then removed using a wet etch (HCl), exposing the p-type AlGaAs base contact layer (Layer 18). A protective photoresist (PR) layer, is then patterned to outline the base mesa. Layers 9 to 18 are then removed using a selective etch (10:1 $C_6H_8O_7$:$H_2O_2$), and the $In_{0.49}Ga_{0.51}P$ etch-stop layer (Layer 8) is removed by a wet etch (HCl), exposing the heavily doped n-type GaAs sub-collector contact layer (Layer 7), and to form the base mesa. Later, a PR window is formed over the emitter mesa and the collector material, followed by the deposition of AuGe/Ni/Au (750/150/10000 Å) to form n-type metal contacts to the emitter contact layer (Layer 29), and sub-collector contact layer (Layer 7). A metal lift-off process then follows. Later, another PR window is formed over the base mesa and after which Ti/Pt/Au (250/80/1100 Å) is deposited on layer 18 to form the P-type contact. After the metal lift-off step, the sample is then annealed at 350° C. to form ohmic contacts. Then a layer of polyimide is applied and cured at 270° C. to reduce the surface leakage current of the device. An additional layer of silicon nitride is deposited on top of the polyimide using the plasma-enhanced chemical vapor deposition (PECVD) system. Via hole openings to create contacts to emitter, base, and collector metals are defined using another photolithography step. Using Freon 14 ($CF_4$) gas and PR as an etch mask, the dielectric via opening to the silicon nitride layer is performed with a reactive ion etching (RIE) system. The PR is then stripped with cleaning solvents. Oxygen ($O_2$) plasma is used to remove the polyimide layer with the silicon nitride layer acting as an etch mask. After the contact via fabrication step, another photolighography step can be performed to deposit Ti/Au (150 Å/2.5 μm) to form contacts from the device to the ground-signal-ground (GSG) high frequency probing pads.

Figure 13:
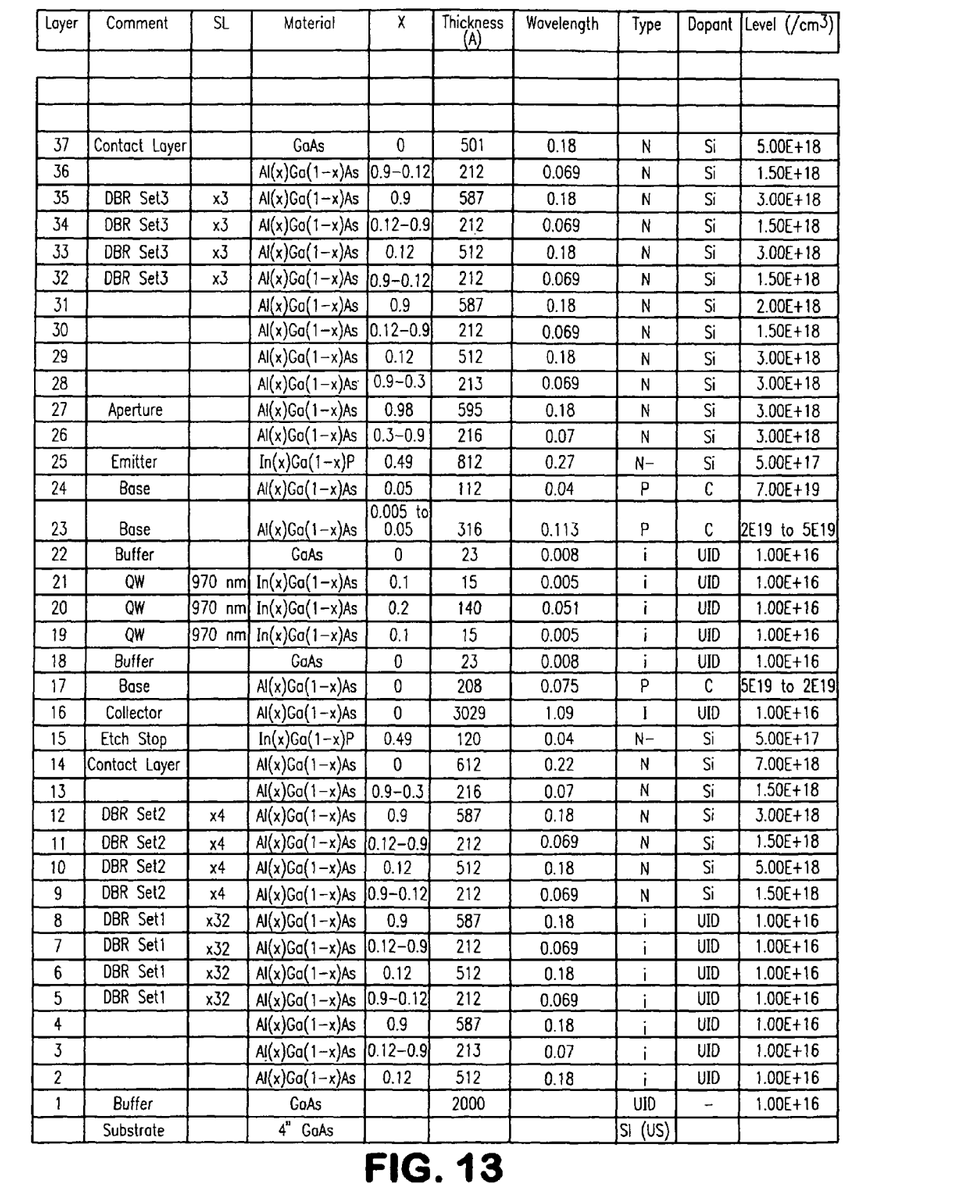
FIG. 13 is a Table showing an example of the layer structure of a QW-HBLET having asymmetrical base design, in accordance with the principles hereof, and provided with a resonant cavity (RC) and called a QW-RCLET.

The table of FIG. 13 shows an example of the layer structure of a QW-HBLET having asymmetrical base design, in accordance with the principles hereof, and provided with a resonant cavity (RC) and called a QW-RCLET. Distributed Bragg reflector (DBR) mirrors are added to the HBLET to form a resonant cavity to assist in light extraction. Top mirror reflection is can be varied from 1% to 95% to form a resonant cavity light emitting transistor. The structure can also be reversed where the top DBR has more reflection than the bottom DBR, which allows for light extraction through the substrate.

Figure 14:
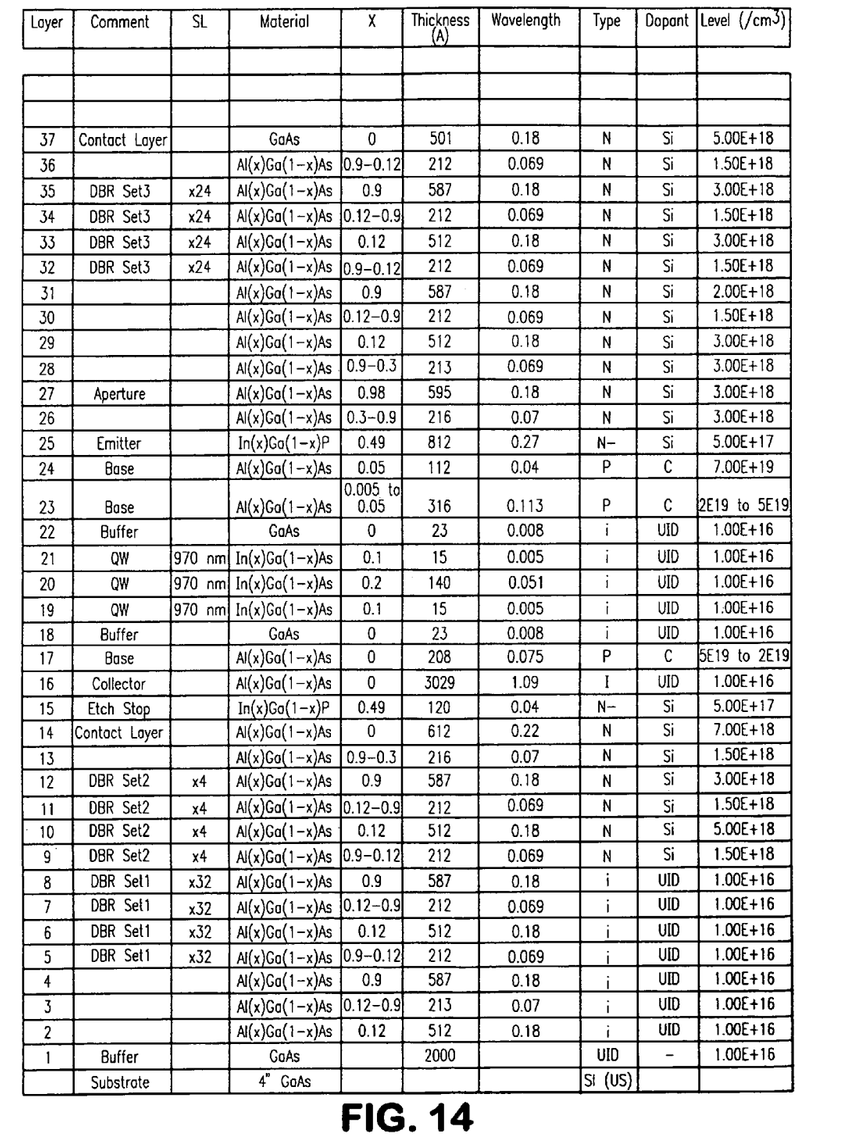
FIG. 14 is a Table showing an example of the layer structure of a quantum well vertical cavity transistor laser (QW-VCTL), having an asymmetrical base design in accordance with the principles hereof.

The table of FIG. 14 shows an example of the layer structure of a quantum well vertical cavity transistor laser (QW-VCTL), having an asymmetrical base design in accordance with the principles hereof. The number of top DBR mirror pairs are increased to enable stimulated emission to occur in a resonant vertical cavity transistor laser. Top mirror reflectivity can be varied from 90% to 99.5%. Likewise, the DBR mirror configuration can be reversed for light extraction through the bottom.

Figure 15:
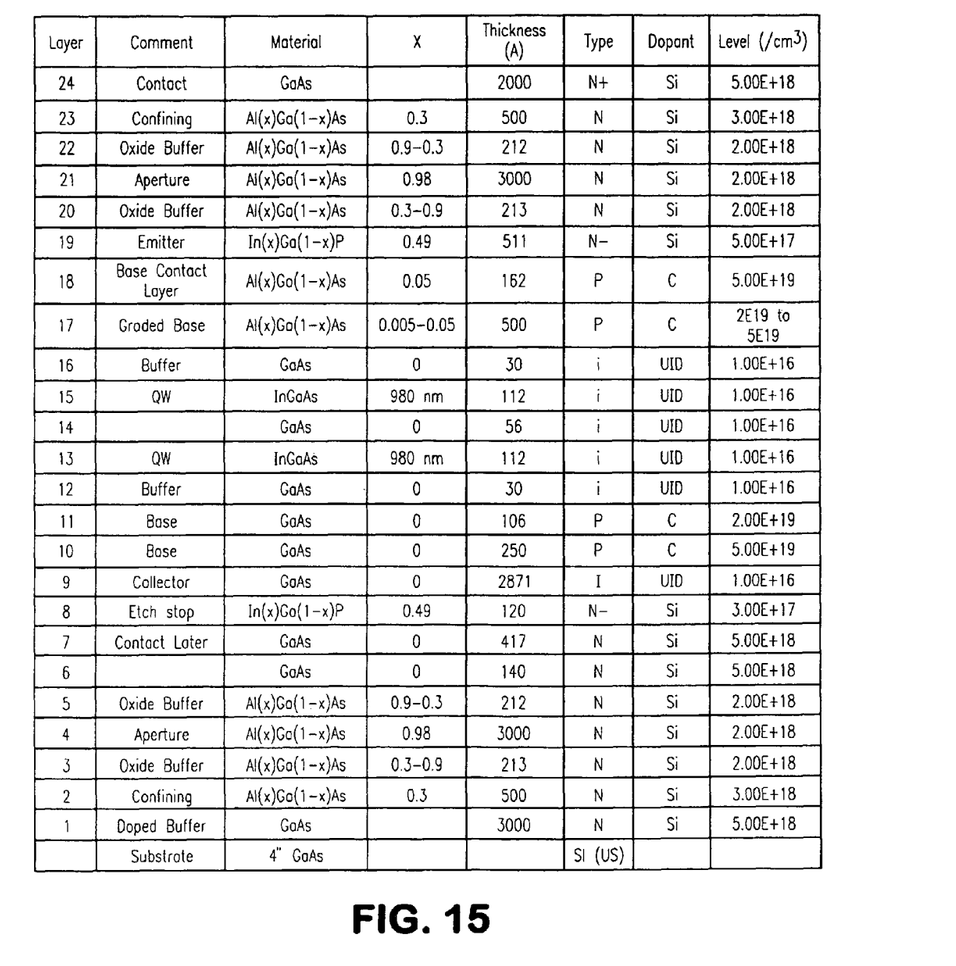
FIG. 15 is a Table showing an example of the layer structure of a quantum well-heterojunction bipolar transistor laser (QW-HBTL) with an edge emitting design (that can employ reflective edge facets) and having an asymmetrical base design in accordance with the principles hereof.

The table of FIG. 15 shows an example of the layer structure of a quantum well-heterojunction bipolar transistor laser (QW-HBTL) with an edge emitting design (that can employ reflective edge facets) and having an asymmetrical base design in accordance with the principles hereof. Thicknesses in layer 4 and 21 are increased to 3000 Å in order to allow waveguiding effects.

Figure 16:
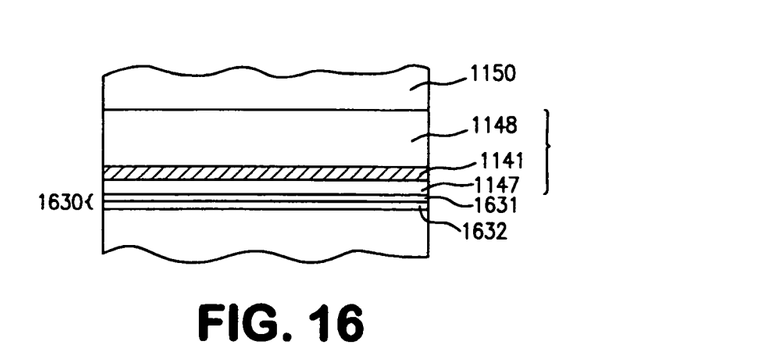
FIG. 16 is a partially broken away diagram of the basic layer structure of a QW-HBLET as in FIG. 11, but modified to employ a tunnel junction collector.

FIG. 16 shows a variation of the device of FIG. 11 in which a tunnel junction 1630 is utilized instead of the device's collector. Reference can be made, for example, to Tunnel Junction Transistor Laser, M. Feng, N. Holonyak, Jr., H. W. Then, C. H. Wu, and G. Walter, Appl. Phys. Lett. 94, 04118 (2009), with regard to employing a tunnel junction as a collector in an HBTL. In FIG. 16, the p+ layer 1631 of the tunnel junction 1630 is adjacent the base sub-region 1147, and the n+ layer 1632 of the tunnel junction 1630 is adjacent the n-type collector contact layer. The asymmetrical base features are as previously described.

The invention claimed is:

1. A method for improving operation of a light emitting transistor, comprising the steps of:
providing a light emitting transistor that includes emitter, base, and collector semiconductor regions, and a quantum size region within the base region, said base region comprising a first base sub-region on the emitter side of said quantum size region, and a second base sub-region on the collector side of said quantum size region; and
providing said first and second base sub-regions with band structures that are asymmetrical with respect to each other, comprising providing said first base sub-region with higher bandgap semiconductor material than the semiconductor material of said second base sub-region.

2. The method as defined by claim 1, wherein said step of providing said first base sub-region with a higher bandgap semiconductor material than the semiconductor material of said second base sub-region includes providing said first base sub-region with a graded bandgap semiconductor material and said second base sub-region with a uniform bandgap semiconductor material.

3. The method as defined by claim 2, wherein said step of providing said first base sub-region with a graded bandgap semiconductor material comprises providing said first base sub-region with a material that is graded to have a gradually increasing bandgap in the direction of said emitter.

4. The method as defined by claim 1, wherein said step of providing said first base sub-region with a higher bandgap semiconductor material than the semiconductor material of said second base sub-region includes providing said first base sub-region with a stepped bandgap semiconductor material, and said second base sub-region with a uniform bandgap semiconductor material.

5. The method as defined by claim 1, wherein said step of providing said first base sub-region with a higher bandgap semiconductor material than the semiconductor material of said second base sub-region includes providing said first base sub-region with a graded and stepped bandgap semiconductor material and said second base sub-region with a uniform bandgap semiconductor material.

6. The method as defined by claim 1, wherein said step of providing a quantum size region within said base region comprises providing at least one quantum well within said base region.

7. The method as defined by claim 1 wherein said step of providing a quantum size region within said base region comprises providing at least one layer of quantum dots within said base region.

8. The method as defined by claim 1, wherein said step of providing a quantum size region within the base region comprises providing at least one shallow quantum well having a single energy state.

9. The method as defined by claim 1, further comprising providing an optical cavity enclosing at least a portion of said base region.

10. The method as defined by claim 1, further comprising providing an optical resonant cavity enclosing at least a portion of said base region, and wherein said light emitting transistor is a transistor laser.

11. A semiconductor light emitting device, comprising:
a heterojunction bipolar light-emitting transistor having a base region between emitter and collector regions;
emitter, base, and collector electrodes for coupling electrical signals with said emitter, base, and collector regions, respectively; and
a quantum size region in said base region;
said base region including a first base sub-region on the emitter side of said quantum size region, and a second base sub-region on the collector side of said quantum size region; and
said first and second base sub-regions having band structures that are asymmetrical with respect to each other, with said first base sub-region comprising relatively higher bandgap semiconductor material and said second base sub-region comprising relatively lower bandgap semiconductor material.

12. The device as defined by claim 11, wherein said first base sub-region comprises a graded bandgap semiconductor material and said second base sub-region comprises a uniform bandgap semiconductor material.

13. The device as defined by claim 12, wherein said graded bandgap semiconductor material is graded to have a gradually increasing bandgap in the direction of said emitter.

14. The device as defined by claim 11, wherein said first base sub-region comprises a stepped bandgap semiconductor material and said second base sub-region comprises a uniform bandgap semiconductor material.

15. The device as defined by claim 11, wherein said first base sub-region comprises a graded and stepped bandgap semiconductor material and said second base sub-region comprises a uniform bandgap semiconductor material.

16. The device as defined by claim 11, wherein said quantum size region within said base region comprises at least one quantum well within said base region.

17. The device as defined by claim 11, wherein said quantum size region within said base region comprises at least one layer of quantum dots within said base region.

18. The device as defined by claim 11, further comprising an optical resonant cavity enclosing at least a portion of said base region, and wherein said light emitting transistor is a transistor laser.

19. The device as defined by claim 18, wherein said transistor laser comprises a vertical cavity transistor laser.

20. The device as defined by claim 18, wherein said transistor laser comprises an edge-emitting transistor laser.

21. The device as defined by claim 11, wherein said collector region comprises a tunnel junction comprising an n+ layer and a p+ layer, with said p+ layer being adjacent said base region.

22. A method for improving operation of a light emitting transistor, comprising the steps of:
    providing a light emitting transistor that includes emitter, base, and collector semiconductor regions, and a shallow quantum well having a single energy state within the base region, said base region comprising a first base sub-region on the emitter side of said quantum well, and a second base sub-region on the collector side of said quantum well; and
    providing said first and second base sub-regions with band structures that are asymmetrical with respect to each other.

23. The method as defined by claim 22, further comprising providing an optical cavity enclosing at least a portion of said base region.

24. The method as defined by claim 22, further comprising providing an optical resonant cavity enclosing at least a portion of said base region, and wherein said light emitting transistor is a transistor laser.

25. A semiconductor light emitting device, comprising:
    a heterojunction bipolar light-emitting transistor having a base region between emitter and collector regions;
    emitter, base, and collector electrodes for coupling electrical signals with said emitter, base, and collector regions, respectively; and
    a shallow quantum well in said base region, said quantum well having a single energy state;
    said base region including a first base sub-region on the emitter side of said quantum well, and a second base sub-region on the collector side of said quantum well; and
    said first and second base sub-regions having band structures that are asymmetrical with respect to each other.

26. The device as defined by claim 25, further comprising an optical cavity enclosing at least a portion of said base region.

27. The device as defined by claim 25, further comprising an optical resonant cavity enclosing at least a portion of said base region, and wherein said light emitting transistor is a transistor laser.

* * * * *